United States Patent
Cho et al.

(10) Patent No.: US 11,989,873 B2
(45) Date of Patent: May 21, 2024

(54) STOCHASTIC CONTOUR PREDICTION SYSTEM, METHOD OF PROVIDING THE STOCHASTIC CONTOUR PREDICTION SYSTEM, AND METHOD OF PROVIDING EUV MASK USING THE STOCHASTIC CONTOUR PREDICTION SYSTEM

(71) Applicant: Samsung Electronics Co., Ltd., Suwon-si (KR)

(72) Inventors: Wooyong Cho, Gyeonggi do (KR); Gun Huh, Gyeonggi do (KR)

(73) Assignee: Samsung Electronics Co., Ltd. (KR)

( * ) Notice: Subject to any disclaimer, the term of this patent is extended or adjusted under 35 U.S.C. 154(b) by 413 days.

(21) Appl. No.: 17/495,863

(22) Filed: Oct. 7, 2021

(65) Prior Publication Data

US 2022/0292669 A1    Sep. 15, 2022

(30) Foreign Application Priority Data

Mar. 10, 2021    (KR) .................. 10-2021-0031466

(51) Int. Cl.
*G06T 7/00*    (2017.01)
*G03F 7/00*    (2006.01)
*G06F 18/2415*    (2023.01)
*G06N 3/047*    (2023.01)
*G06N 3/088*    (2023.01)

(52) U.S. Cl.
CPC .......... *G06T 7/0006* (2013.01); *G03F 7/7065* (2013.01); *G06F 18/2415* (2023.01); *G06N 3/047* (2023.01); *G06N 3/088* (2013.01); *G06T 2207/10061* (2013.01);
(Continued)

(58) Field of Classification Search
CPC ......... G06T 7/0006; G06T 2207/10061; G06T 2207/20081; G06T 2207/20084; G06T 2207/30148; G06T 7/0004; G06T 7/12; G06T 5/40; G03F 7/7065; G03F 7/705; G03F 7/70666; G03F 7/70441; G03F 1/22; G03F 1/36; G03F 1/70; G03F 7/70625; G06F 18/2415; G06N 3/047; G06N 3/088; G06N 3/045; G06N 3/0475; G06N 7/01;
(Continued)

(56) References Cited

U.S. PATENT DOCUMENTS 9,116,438 B2    8/2015    Lee et al.
10,262,408 B2    4/2019    Park et al.
(Continued)

FOREIGN PATENT DOCUMENTS

KR        20210069161 A    6/2021

*Primary Examiner* — Ping Y Hsieh
(74) *Attorney, Agent, or Firm* — Myers Bigel, P.A.

(57) ABSTRACT

The inventive concepts provide a method of providing a stochastic prediction system. The method includes extracting contours of patterns corresponding to a first design layout from a plurality of scanning electron microscope (SEM) images, respectively, generating a first contour histogram image based on the contours, and training a stochastic prediction model by using the first contour histogram image as an output, and by using the first design layout and a first resist image, a first aerial image, a first slope map, a first density map, and/or a first photo map corresponding to the first design layout as inputs, in which the stochastic prediction model comprises a cycle generative adversarial network (GAN).

20 Claims, 13 Drawing Sheets

(52) U.S. Cl.
CPC ............... *G06T 2207/20081* (2013.01); *G06T 2207/20084* (2013.01); *G06T 2207/30148* (2013.01)

(58) Field of Classification Search
CPC ...... G06N 20/00; G06V 10/469; G06V 10/82; G06V 20/695
See application file for complete search history.

(56) References Cited

U.S. PATENT DOCUMENTS

| | | | |
|---|---|---|---|
| 10,648,919 B2* | 5/2020 | Witte | G01J 1/42 |
| 10,672,588 B1 | 6/2020 | Pathangi et al. | |
| 10,747,119 B2 | 8/2020 | Huang et al. | |
| 2008/0183323 A1* | 7/2008 | Menadeva | G06T 7/12 |
| | | | 700/109 |
| 2017/0345725 A1* | 11/2017 | Hu | H01L 22/12 |
| 2018/0106831 A1 | 4/2018 | Budach et al. | |
| 2020/0249578 A1 | 8/2020 | Hsu et al. | |
| 2021/0165333 A1* | 6/2021 | Cho | G03F 7/70033 |

\* cited by examiner

Designed location of contour

STOCHASTIC CONTOUR PREDICTION SYSTEM, METHOD OF PROVIDING THE STOCHASTIC CONTOUR PREDICTION SYSTEM, AND METHOD OF PROVIDING EUV MASK USING THE STOCHASTIC CONTOUR PREDICTION SYSTEM

CROSS-REFERENCE TO RELATED APPLICATION

This application is based on and claims priority under 35 U.S.C. § 119 to Korean Patent Application No. 10-2021-0031466, filed on Mar. 10, 2021, in the Korean Intellectual Property Office, the disclosure of which is incorporated by reference herein in its entirety.

BACKGROUND

The inventive concepts relate to a semiconductor process, and more particularly, to a system for stochastically predicting a contour of patterns to be formed by a patterning process using an extreme ultraviolet (EUV) beam.

Recently, as memory cell sizes have been reduced for higher integration of information communication devices, operation circuits for operations of semiconductor devices and wiring structures for electrical connections have become complicated. Thus, in the manufacturing of semiconductor devices, the application of an extreme ultraviolet (EUV) lithography process has increased. EUV lithography, which is a lithography technique using light, for example, having a wavelength in a range of 4 nm through 124 nm (e.g., 13.5 nm), enables processing of ultra-fine dimensions less than or equal to 20 nm (sub-20 nm). The ultra-fine dimensions may be difficult to implement with some lithography techniques using ArF excimer laser light. However, as the number of photons per EUV patterning area is reduced to $\frac{1}{14}$ of the number of photons used with deep UV (DUV) patterning, EUV patterning is prone to patterning defects caused by random distribution of photons.

SUMMARY

The inventive concepts provide a method of providing a system for stochastically predicting a contour to be formed by a patterning process using an extreme ultraviolet (EUV) beam and a method of providing an EUV mask using the system.

The inventive concepts also provide a method of providing a stochastic prediction system. The method of providing a system for stochastically predicting a contour includes extracting contours of patterns corresponding to a first design layout from a plurality of scanning electron microscope (SEM) images respectively, generating a first contour histogram image based on the contours, and training a stochastic prediction model by using the first contour histogram image as an output, and by using the first design layout and a first resist image, a first aerial image, a first slope map, a first density map, and/or a first photo map corresponding to the first design layout as inputs, in which the stochastic prediction model includes a cycle generative adversarial network (GAN).

According to some embodiments, there is provided a method of providing an EUV photomask. The method includes providing a design layout, performing an optical proximity correction (OPC) on the design layout, verifying the OPC, and manufacturing an EUV photomask responsive to determining that a result of the verifying of the OPC is correct, in which the verifying of the result of the OPC includes generating a contour histogram image, based on the design layout and a resist image, an aerial image, a slope map, a density map, and/or a photon map corresponding to the design layout, and a value of a pixel included in the contour histogram image indicates a probability that a contour of patterns included in the design layout is located in the pixel.

According to some embodiments, there is provided a system configured to stochastically predict a defect caused by a lithography process. The system includes a stochastic prediction model configured to generate a first contour histogram image. The first contour histogram image is generated based on a first design layout and a first resist image, a first aerial image, a first slope map, a first density map, and/or a first photon map corresponding to the first design layout, and a value of a pixel included in the first contour histogram image indicates a probability that a contour of patterns included in the design layout is located in the pixel.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
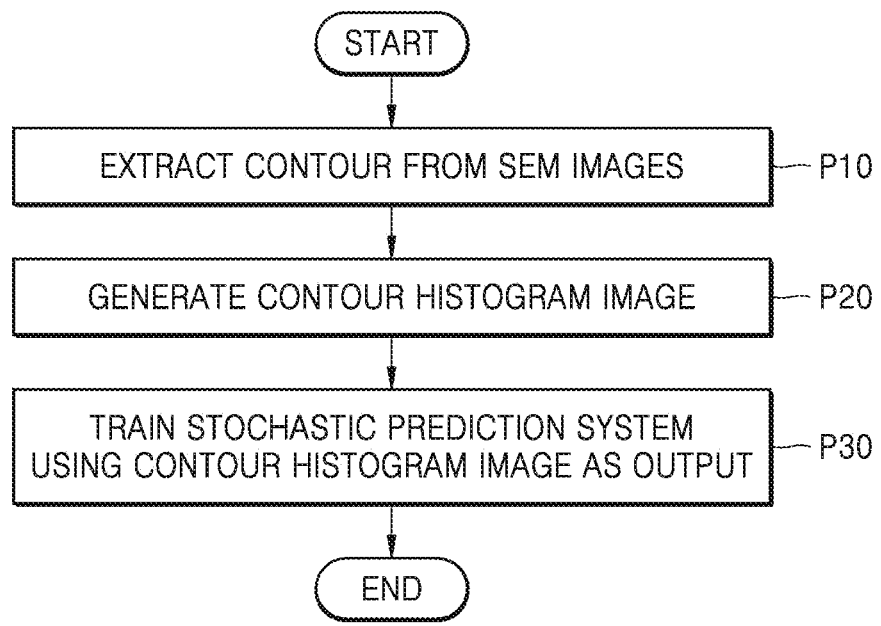
FIG. 1 is a flowchart showing a method of training a stochastic prediction model, according to some embodiments of the inventive concepts.

Hereinafter, embodiments of the inventive concepts will be described in detail with reference to the accompanying drawings. Like components in the drawings will be referred to as like reference numerals, and will not be repeatedly described.

FIG. 1 is a flowchart showing a method of training a stochastic prediction model, according to some embodiments of the inventive concepts.

FIGS. 2 through 6C are views for describing a method of training a stochastic prediction model, according to some embodiments of the inventive concepts.

Figure 2:
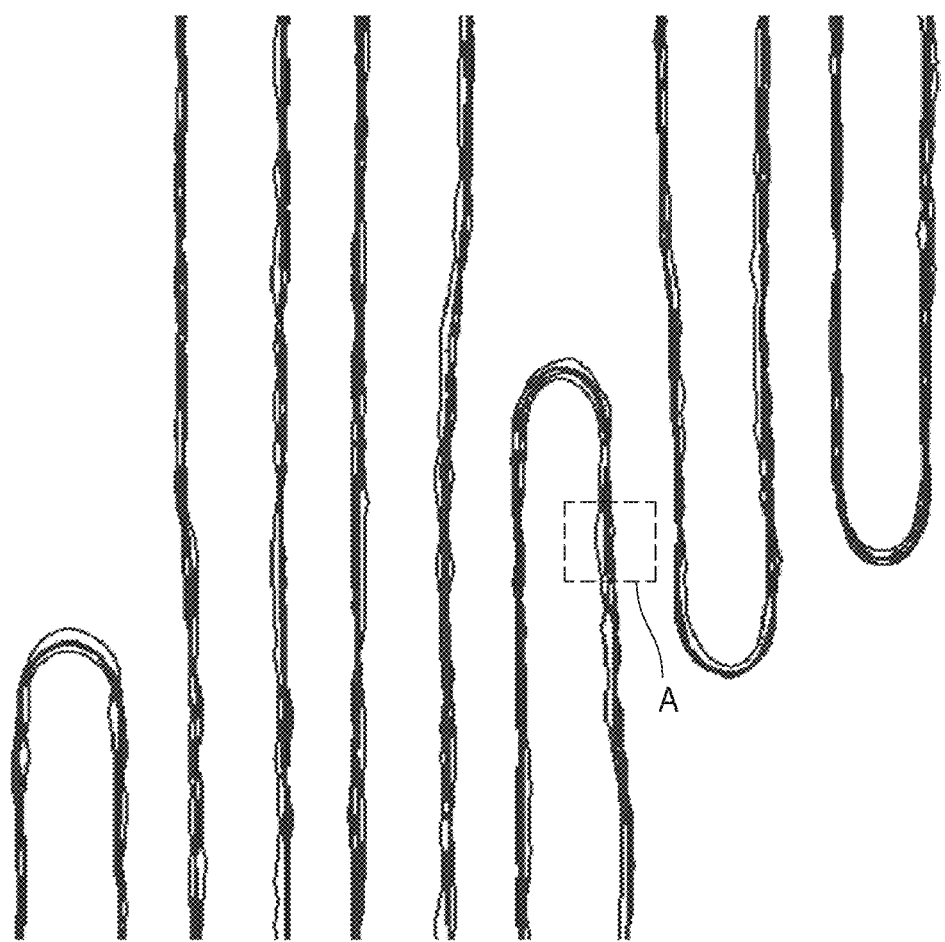
FIGS. 2, 3, 4A, 4B, 4C, 5A, 5B, 6A, 6B, and 6C are views for describing a method of training a stochastic prediction model, according to some embodiments of the inventive concepts.

Referring to FIGS. 1 and 2, in operation P10, a contour may be extracted from images obtained through a scanning electron microscope (SEM). An SEM image may be generated from SEM equipment or NGR equipment of NGR Inc. (formerly NanoGeometry® Research). In operation P10, a binary image indicating a contour of a measured layout may be generated.

Herein, the SEM image may be an image of a photoresist pattern generated by after-development inspection or an image of a real circuit pattern generated by after-clean inspection. FIG. 2 shows an overlapping of different contours by merging a contour image extracted from an SEM image with respect to the same region of different wafers or different chips of the same wafer.

Figure 3:
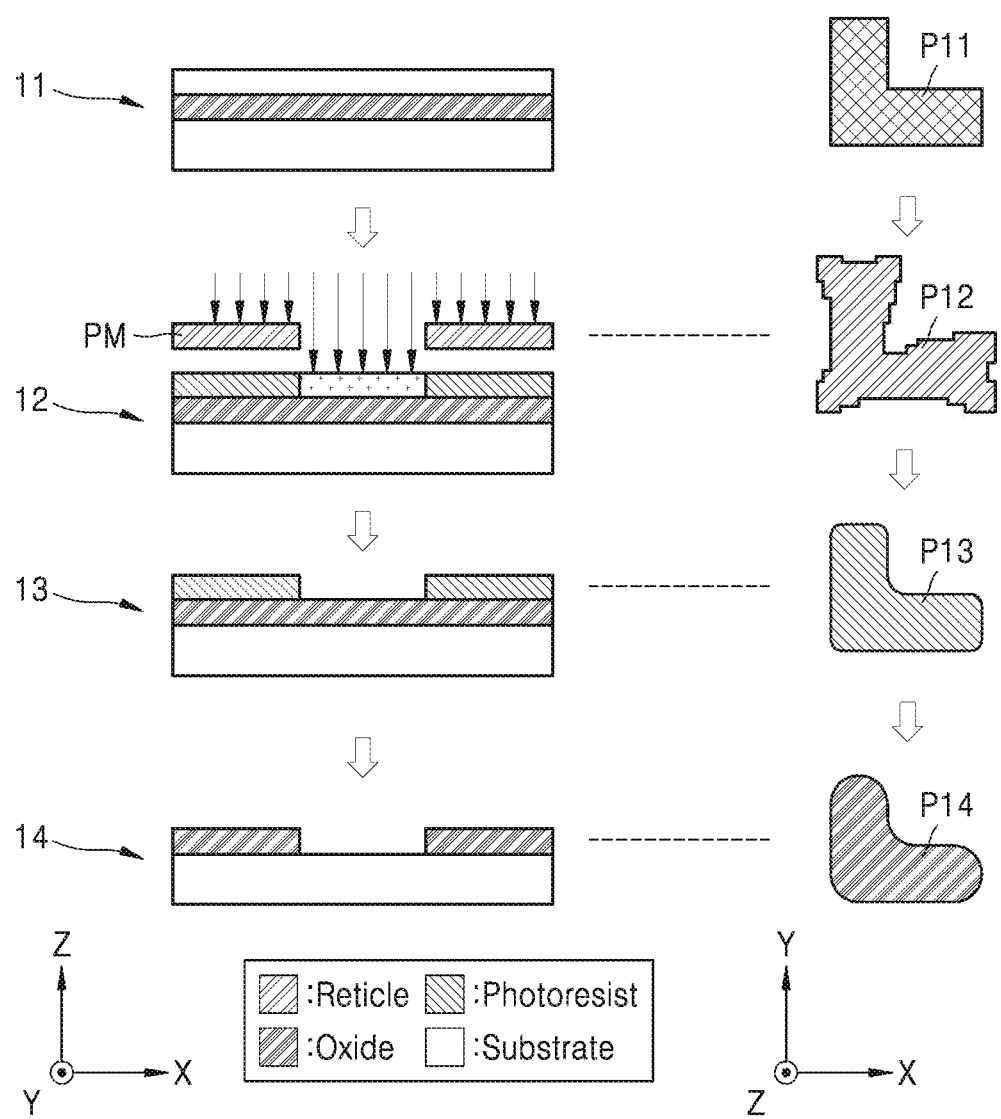

Herein, referring to FIG. 3, a lithography process will be described. FIG. 3 shows a process of manufacturing an integrated circuit through a lithography semiconductor process. More specifically, the left side of FIG. 3 sequentially shows cross-sectional views of a structure formed by a semiconductor process, and the right side of FIG. 3 sequentially shows plan views of a structure formed by a semiconductor process. As shown in FIG. 3, the integrated circuit may include patterns formed by a plurality of layers stacked in a Z-axis direction.

The semiconductor process may include various sub-processes for forming patterns included in the integrated circuit. For example, the semiconductor process may include photolithography. The photolithography may be a process of forming a pattern by transferring a geometric pattern from a photomask to a photoresist by using light. The photoresist may include a positive photoresist in which a light-irradiated part is dissolved by a developer and a negative photoresist in which a part to which light is not irradiated is dissolved by the developer. FIG. 3 shows an example of photolithography for forming a first pattern P11 having a shape "L" on an oxide layer by using a positive photoresist. Herein, a pattern having an optimal shape desired by a designer like the first pattern P11 may be indicated as an ideal pattern.

While the processing of an oxide layer formed on a wafer will be described in the example of FIG. 3, those of ordinary skill in the art will understand the processing of various materials such as a metal layer, a dielectric material layer, a crystalline/amorphous silicon layer, etc., on a wafer based on the description made herein.

Referring to the left side of FIG. 3, a first structure 11 may include a wafer, an oxide layer, and a photoresist layer stacked sequentially. For example, the oxide layer may be formed on a cleaned wafer and the positive photoresist may be applied onto the oxide layer. In some embodiments, the positive photoresist may be applied onto the oxide layer by spin coating. In some embodiments, after application of the photoresist, the wafer may be heated to remove an excess solvent, which is referred to as pre-exposure baking.

A material forming the photoresist layer may be sensitive to at least one of ultraviolet (UV) rays, deep UV (DUV) rays, extreme UV (EUV) rays, excimer laser beams, X rays, and electrons. Herein, expressions such as "at least one of," when preceding a list of elements, modify the entire list of elements and do not modify the individual elements of the list. In the case of an EUV exposure process, the number of photons is less than that in an exposure process such as DUV, etc., requiring the use of a material having a high EUV absorbance. Thus, a photoresist material for EUV may include, for example, hydroxystyrene which is a polymer. Moreover, iodophenol may be provided as an additive to an EUV photoresist.

According to some embodiments, a thickness of the photoresist layer may range from about 0.1 μm to about 2 According to some embodiments, a thickness of the photoresist layer may range from about 200 μm to about 600 The EUV photoresist may be provided to a thin thickness by spin-coating a photoresist solution of a thin concentration.

In some embodiments, the photoresist may include an inorganic material such as thin oxide. In this case, when the photoresist is removed through a strip process after completion of a lithography process and a subsequent process, the inorganic material may remain at a concentration of about $1 \times 10^{11}/cm^3$ or less on an underlayer of the photoresist. When the inorganic material is used as the photoresist, the thickness of the photoresist may be easily reduced and etching selectivity is high, thus implementing a thin hard mask layer.

For a thick thickness of an etching target layer, the hard mask layer including amorphous carbon may be further provided under the photoresist. According to some embodiments, the hard mask layer may further include fluorine. When the hard mask layer includes fluorine, the EUV sensitivity of the photoresist may be enhanced. Moreover, an antireflection layer may be further provided between the hard mask layer and the photoresist.

A photomask PM may be aligned on the first structure 11 and a radiation beam may be irradiated onto the aligned photomask PM, thus forming a second structure 12. As shown in FIG. 3, the positive photoresist exposed to the radiation beam on the photoresist layer may be chemically modified. In some embodiments, the photomask PM may be indicated as a reticle, and may include a material (e.g., chromium (Cr)) through which the radiation beam does not pass, on a glass layer or under the glass layer.

The radiation beam may include UV rays, DUV rays, EUV rays, excimer laser beams, X rays, electron beams, etc. According to some embodiments, a wavelength of the EUV radiation rays may range from about 4 nm to about 124 nm. According to some embodiments, a wavelength of the EUV radiation rays may range from about 5 nm to about 20 nm. According to some embodiments, a wavelength of the EUV radiation rays may range from about 13 nm to about 14 nm. According to some embodiments, a wavelength of the EUV radiation rays may be about 13.5 nm.

A radiation system for generating EUV radiation rays may include a laser for exciting a plasma source to provide plasma and a source collector module for storing the plasma. For example, by irradiating the laser beam to the plasma source such as a particle of tin and Xe gas or Li steam, the plasma may be generated. Such a radiation system may be generally referred to as a laser production plasma (LPP) source. The LPP source may be replaced with a discharging plasma source or a source based on synchrotron copying provided by an electron storage ring.

Generally, an exposure process using an EUV radiation beam may be performed in the manner of axial projection (e.g., axial projection of about 4:1). A mask pattern may be reduced to a size of about ¼ to be mapped to a semiconductor wafer, such that a full shot may correspond to a size of about ¼ of the entire mask pattern. Herein, ¼ may be a reduction ratio in terms of a length, and may correspond to reduction of about 1/16 in terms of an area. Thus, a pattern formed on the lithography mask may have larger threshold dimensions than a pattern actually mapped to a wafer, thereby improving the reliability of the lithography process.

Herein, an exposure scheme may be classified into a scanning scheme that performs continuous photographing and a step scheme that performs photographing step-by-step. The EUV exposure process is generally performed using the scanning scheme, and an EUV exposure device is generally referred to as a scanner. Moreover, in the EUV exposure device, scanning may be performed using a slit that limits light to a partial region of the mask. Herein, the slit may be a unit for uniformly irradiating light to the EUV photomask by limiting the light in a device for performing an EUV exposure process. The light may be limited to be irradiated to a partial region of the mask through the slit, and the light may be continuously irradiated while moving the mask in a direction that is opposite to a scanning direction. As such, a region on a test wafer to which light is irradiated through scanning over the entire region of the mask may be a region corresponding to a full shot.

According to some embodiments, the photomask PM may be an EUV photomask. According to some embodiments, the photomask PM may include a silicon wafer, a plurality of silicon layers arranged alternately on the silicon wafer, and a molybdenum layer. The photomask PM may further include a ruthenium (Ru)-containing layer arranged on alternately stacked silicon-molybdenum layers. A layout pattern including a tantalum boron nitride (TaBN)-containing layer and a lawrencium-containing layer may be formed on the ruthenium-containing layer. Various materials layers disclosed herein for the photomask PM for EUV are merely intended for illustration, and are not intended to limit the scope of the inventive concepts.

Light passing through an opening of the photomask PM may be diffracted. As the size of patterns of the photomask PM decreases, an optical proximity effect (OPE) may occur due to an influence between adjacent ones of the patterns. To compensate for an error caused by the diffraction and the OPE described above, optical proximity correction (OPC) may be adopted. For example, as shown in the right side of FIG. 3, to form the first pattern P11, a second pattern P12 to which OPC is applied may be formed on the photomask PM, and the second pattern P12 may have a shape that is different from that of the first pattern P11. The second pattern P12 may have a shape that is corrected by OPC.

A developing process may be performed on the second structure 12 to remove a light-irradiated part of a photoresist layer by using a developer. Thus, as shown in FIG. 3, a third pattern P13 may be formed on the photoresist layer. In some embodiments, the developer may be provided by a spinner like the photoresist.

Etching may be performed in a third structure 13, such that a part of the oxide layer that is not protected by the photoresist may be etched. Etching may include wet (or liquid) etching and dry (or plasma) etching. Etching may remove a part of a topmost layer that is not protected by the photoresist. After completion of etching, the photoresist may be removed by a cleaning process, such that as shown in FIG. 3, a fourth pattern P14 may be formed on the oxide layer. According to some embodiments, the wafer may be heated to remove a residual solvent through a cleaning process.

As shown in FIG. 3, as sub processes are performed, the shape of a pattern may be transformed, which may be modelled through pattern transformation. For example, the first pattern P11 corresponding to the ideal pattern may be transformed into the second pattern P12 through application of OPC, and the second pattern P12 may be transformed into the third pattern P13 in an after development inspection (ADI) state through irradiation and development. The third pattern P13 may be transformed into a fourth pattern P14 in an after clean inspection (ACI) state through etching and cleaning. As a result, the fourth pattern P14 may have a shape that is different from the ideal pattern, i.e., the first pattern P11, but it may be important to determine a shape of the second pattern P12 such that the fourth pattern P14 may have a shape that is more or most similar to the first pattern P11.

Estimation of the third pattern P13 that is a photoresist pattern after development from the second pattern P12 that is a pattern on the photomask PM by simulating an error originating from diffraction of light passing through the photomask PM may be referred to as optical rule check (ORC).

Next, referring to FIG. 1 and FIGS. 4A through 4C, a contour histogram image may be generated in operation P20.

Figure 4A:
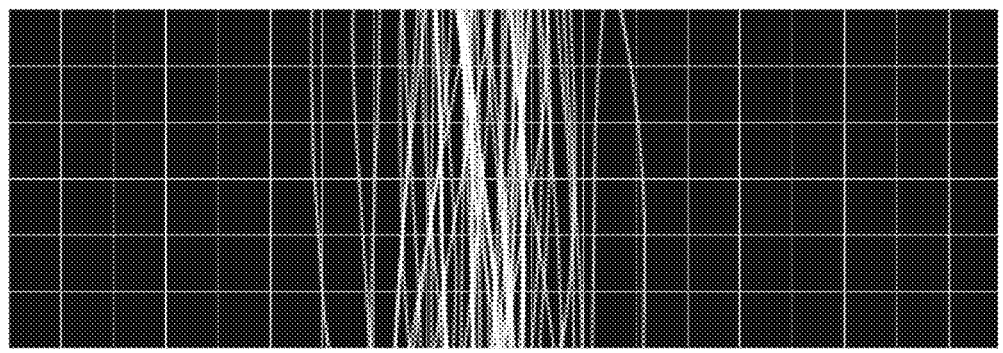
Figure 4B:
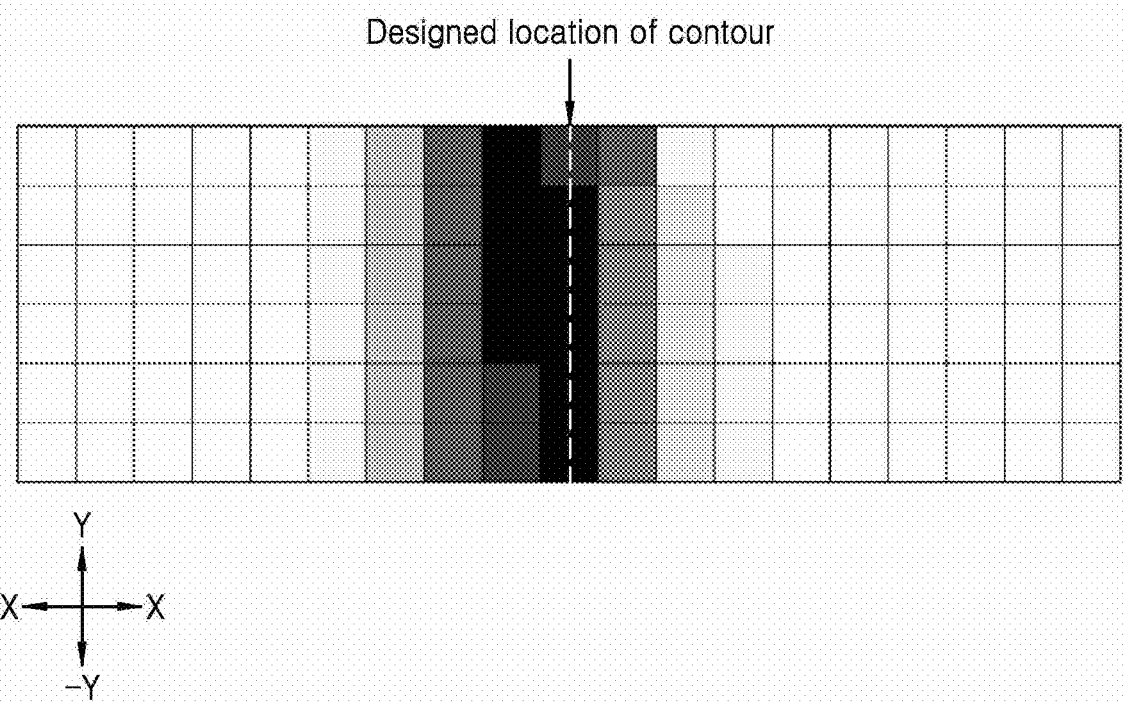
Figure 4C:
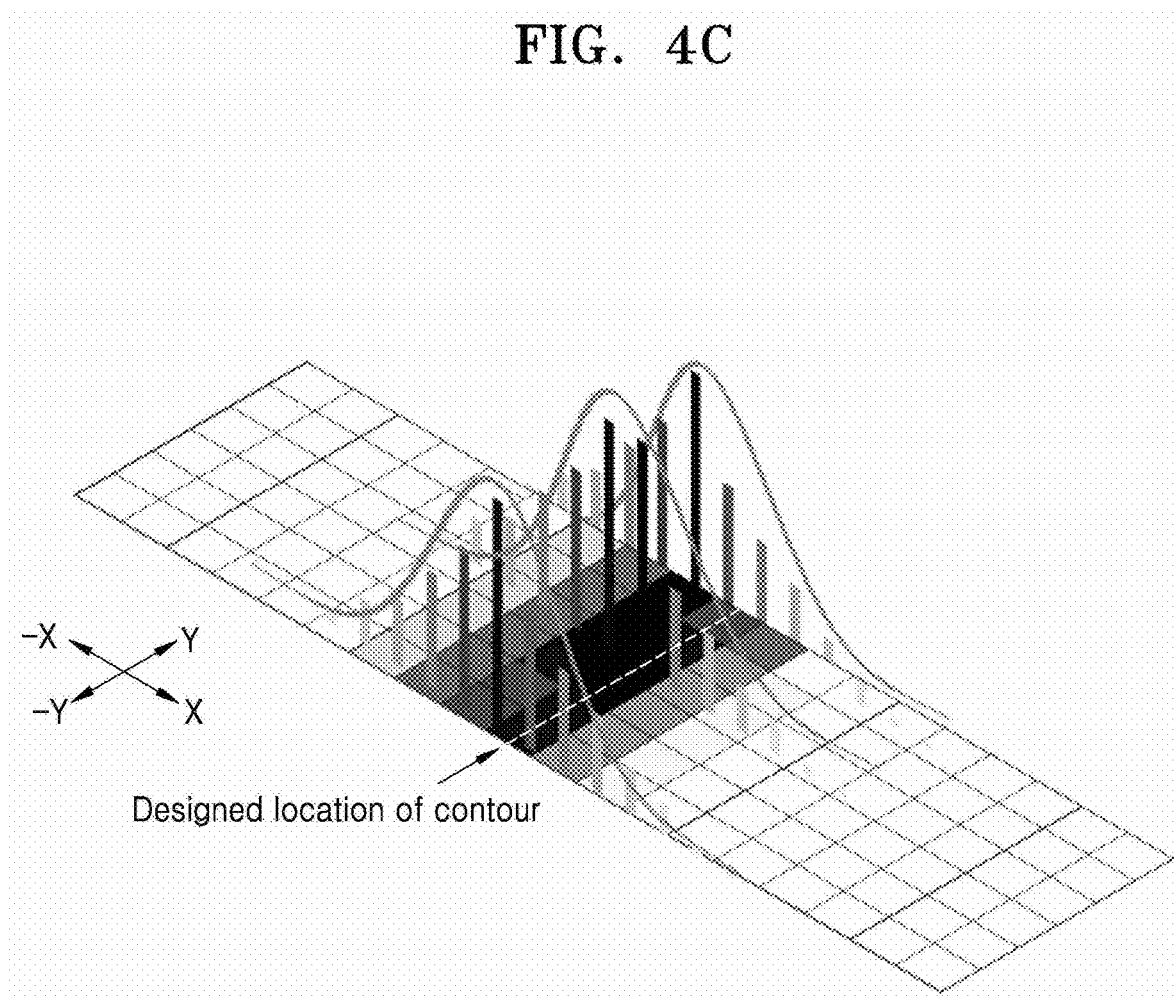

FIG. 4A is an enlarged view of a portion A of FIG. 2, FIG. 4B shows a contour histogram image derived from contours of FIG. 4A, and FIG. 4C is a schematic view showing a histogram including values of some pixels on a contour histogram image.

FIG. 4A shows a grayscale image into which a plurality of contours extracted from a plurality of SEM images are transformed. The number of contours placed in each pixel may be counted in FIG. 4A.

Based on the number of contours counted in FIG. 4A, a brightness (i.e., a bit value) of each pixel may be determined, such that contour histogram images of FIGS. 4B and 4C may be generated. According to some embodiments, a contour histogram image may be a grayscale image.

For example, when the number of contours passing through a first pixel shown in FIGS. 4B and 4C is 4, a bit value of the first pixel may be 4. In another example, when there is no contour passing through a second pixel that is different from the first pixel, a bit value of the second pixel may be 0.

In another example, after a pixel through which a contour passes and bit values of pixels around the contour are determined to have a Gaussian distribution, a value of each pixel included in a contour histogram image may be determined by a sum of a plurality of Gaussian distributions corresponding to a plurality of contours.

According to some embodiments, a contour histogram image may be an 8-bit grayscale image, without being limited thereto. The 8-bit grayscale image may be standardized such that a value of a pixel having the maximum number of contours placed thereon may be 255 and a value of a pixel on which no contour is placed may be 0. The above-described contour histogram image may be a three-dimensional (3D) image having two space orthogonal coordinate axes (e.g., an X axis and a Y axis) and one frequency axis.

In FIGS. 4B and 4C, designed positions of a contour are indicated by arrows and wavy lines. Based on deviation of a direction (e.g., ±X directions) perpendicular to an extension direction (e.g., ±Y directions) of a contour from a designed position of the contour, a mean value, a maximum value, a minimum value, a range, a median value, a mode, and/or a standard deviation of a contour histogram may be determined for each pixel. As used herein, the term "and/or" includes any and all combinations of one or more of the associated listed items. A contour histogram extracted by a stochastic prediction model 10 (see FIG. 6A) in an OPC verification stage after a training stage may also include a mean value, a maximum value, a minimum value, a range, a median value, a mode, and/or a standard deviation which are defined in a similar manner.

Figure 5A:
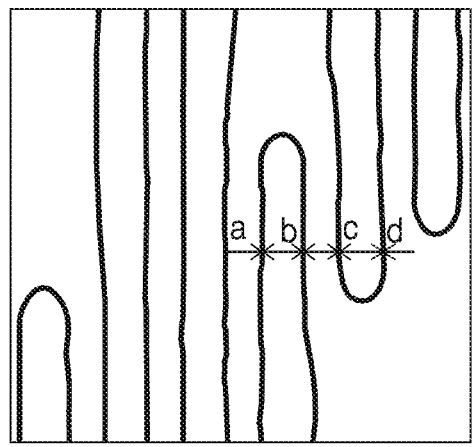
Figure 5B:
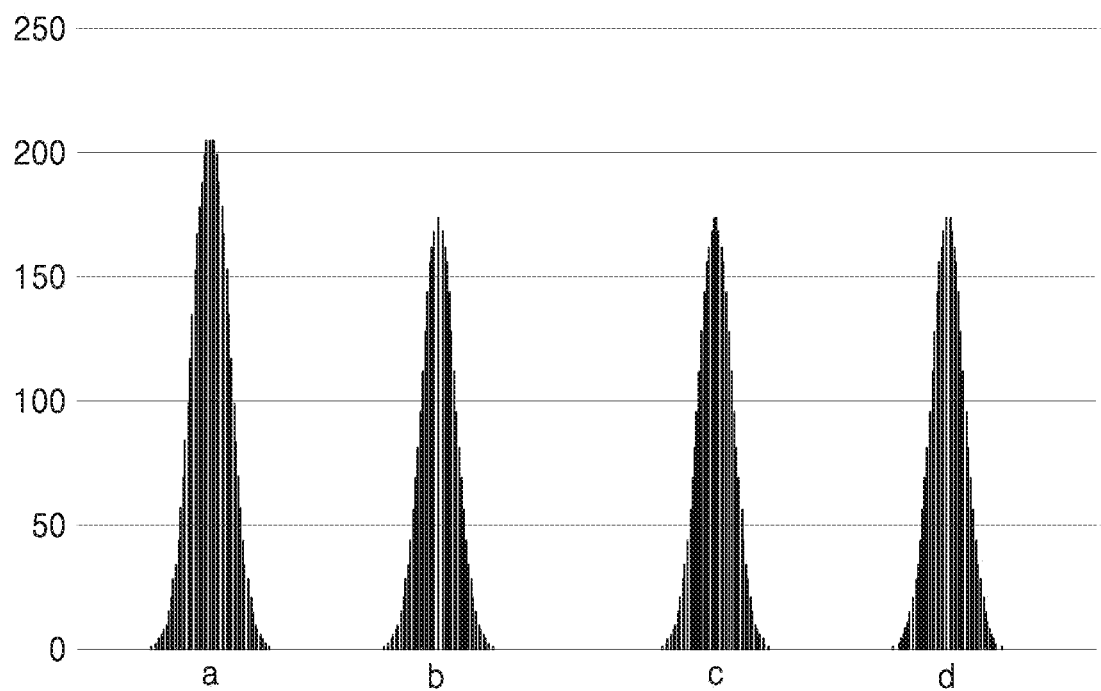

Likewise, a histogram for each pixel may be generated for all pixels included in an image. FIG. 5A shows a contour histogram image over the entire layout of FIG. 2, and FIG. 5B shows a contour histogram for four positions indicated by 'a', 'b', 'c', and 'd' of FIG. 5A. According to some embodiments, the contour histogram image may include contour histogram data regarding positions of a finite number on the layout.

Figure 6A:
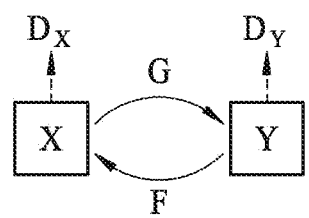
Figure 6B:
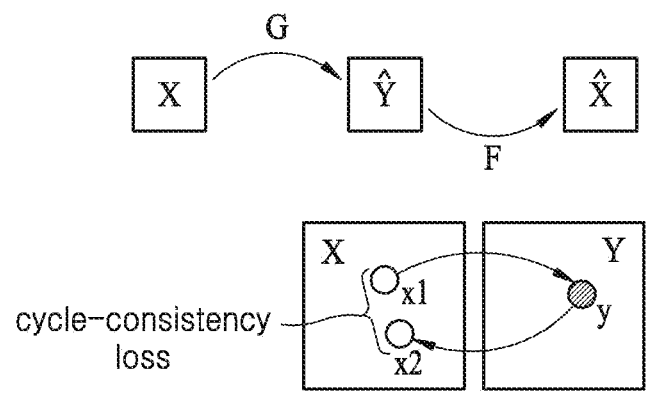
Figure 6C:
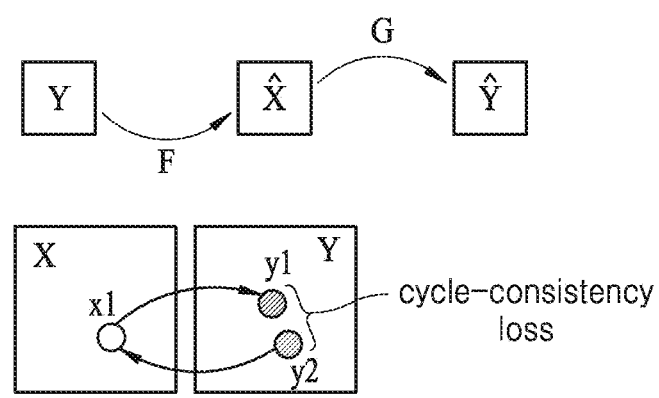

Next, referring to FIGS. 1 and 6A, in P30, the stochastic prediction model 10 may be trained using a contour histogram image as an output.

FIG. 6A is a schematic view showing an example of the stochastic prediction model 10, according to some embodiments of the inventive concepts. The stochastic prediction model 10 may have a random structure capable of training an image-to-image translation. The image-to-image translation may aim at mapping an input image and an output image to each other, by using a training data set including an image pair.

For example, the stochastic prediction model 10 may include an artificial neural network, a decision tree, a support vector machine, a Bayesian network, and/or a genetic algorithm, etc. Hereinbelow, an embodiment where the stochastic prediction model 10 is an artificial neural network will be mainly described. This is merely for convenience of a description, and does not limit the scope of the inventive concepts. The artificial neural network may include, for example, a convolution neural network (CNN), a region with a CNN (R-CNN), a fast R-CNN, a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a full convolutional network, a long short-term memory (LSTM) network, a classification network, etc. According to some embodiments, the stochastic prediction model 10 may be implemented by, for example, a neural processing unit (NPU), a graphic processing unit (GPU), etc.

According to some embodiments, the stochastic prediction model 10 may be a cycle generative adversarial network (GAN). Herein, the cycle GAN, which is an image-to-image mapping model based on a conditional GAN (cGAN), may transform an input image to an output image of another domain.

The GAN may include a generator that generates a fake image from noise and a discriminator that identifies the fake image. For example, the generator may output a fake image and the discriminator may output a probability of being a real image (or a probability of being a fake image). The discriminator may be trained to identify a fake image based on a real image and the fake image, and the generator may be trained to cause the discriminator to identify a fake image generated by the generator as a real image. Thus, the trained generator may generate a fake image that is very similar to the real image. By conditioning the generator and the discriminator based on additional information, the cGAN may be implemented. Herein, the additional information may be auxiliary information of any type like a class label or data of other forms. By inputting the additional information to an additional input layer of each of the generator and the discriminator, conditioning may be performed.

The input image may include at least any one of a design layout, a resist image, an aerial image, a slope map, a density map, and/or a photon map. The design layout may mean a bitmap image or an image of other random proper types including a target pattern to be implemented on a wafer. The resist image may be an image of a photoresist derived from the design layout by simulation. The aerial image may be an image indicating an intensity distribution of exposure light arriving at the photoresist, the image being derived from the design layout. The slope map may be an image in which a value of each pixel included in the slope map is a gradient of each pixel of the aerial image. The density map may be an image where a bit value of a particular pixel is determined by a pattern density around the particular pixel. The photon map may be an image where the number of photons to arrive for each pixel in an exposure process is simulated. The output image may be a contour histogram image described with reference to FIGS. 2 through 5B.

The design layout, the resist image, the aerial image, the slope map, the density map, and the photon map used in a training stage of the stochastic prediction model 10 may be also referred to as a training data set. The training data set may be related to the design layout already transferred to the wafer, and may include an SEM image. The corresponding SEM image may be used for contour extraction described with reference to FIG. 2.

The aim of the cycle GAN is to train a function for mapping a domain X and a domain Y. Herein, x indicates a sample belonging to the domain X and y indicates a sample belonging to the domain Y. The cycle GAN may include two mapping functions $G:X \rightarrow Y$ and $F:Y \rightarrow X$. The mapping functions G and F may have a reverse transcription relationship therebetween. The cycle GAN may further include two adversarial discriminators $D_X$ and $D_Y$.

To reduce a space of a possible mapping function, cycle consistency needs to be satisfied. Herein, cycle consistency may mean that an initial input is derived when the mapping function G and the reverse mapping function F are successively performed on a random input. More specifically, referring to FIG. 6B, mapping of an element x1 of the domain X to an element y of the domain Y by G and mapping of the element y to another element x2 of the domain X by F may be defined as a cycle consistency loss that is an objective function. Likewise, referring to FIG. 6C, mapping of an element x of the domain X to an element y1 of the domain Y by G and mapping of an element y2 that is different from y1 to the element x of the domain X by F may be defined as a cycle consistency loss that is an objective function. By adding the above-described cycle consistency loss to the objective function, mode collapse where the same output image is output regardless of an input image may be prevented.

Thus, the objective function of the cycle GAN may include two types of terms of adversarial losses and cycle consistency losses. More specifically, the objective function of the cycle GAN may follow Equation 1.

$$L(G,F,D_X,D_Y)=L_{GAN}(G,D_Y,X,Y)+L_{GAN}(F,D_X,Y,X)+\lambda L_{cyc}(G,F)$$ [Equation 1]

Herein, $L_{GAN}(G,D_Y,X,Y)$ is an objective function indicating an adversarial loss regarding the mapping function G and may follow Equation 2.

$$L_{GAN}(G,D_Y,X,Y)=E_{y \sim P_{data}(y)}[\log D_Y(y)]+E_{x \sim P_{data}(x)}[\log(1-D_Y(G(x)))]$$ [Equation 2]

G may be intended to minimize the objective function of Equation 2, and $D_Y$ may be intended to maximize the objective function of Equation 2 and may be simply expressed as $\min_G \max_{D_y} L_{GAN}(G,D_Y,X,Y)$.

$L_{GAN}(F,D_X,Y,X)$ is an objective function indicating an adversarial loss regarding the mapping function F and may follow Equation 3.

$$L_{GAN}(F,D_X,Y,X)=E_{x \sim P_{data}(x)}[\log D_X(X)]+E_{y \sim P_{data}(y)}[\log(1-D_X(F(y)))]$$ [Equation 3]

F may be intended to minimize the objective function of Equation 3, and $D_X$ may be intended to maximize the objective function of Equation 3 and may be simply expressed as $\min_G \max_{D_y} L_{GAN}(F,D_X,Y,X)$.

$L_{cyc}(G,F)$ is the above-described cycle consistency loss and may follow Equation 4. λ may be determined based on relative importances of the objective functions of Equation 2 and Equation 3.

$$L_{cyc}(G,F)=E_{x \sim P_{data}(x)}[\|F(G(x))-x\|_1]+E_{y \sim P_{data}(y)}[\|G(F(y))-y\|_1]$$ [Equation 4]

Figure 7:
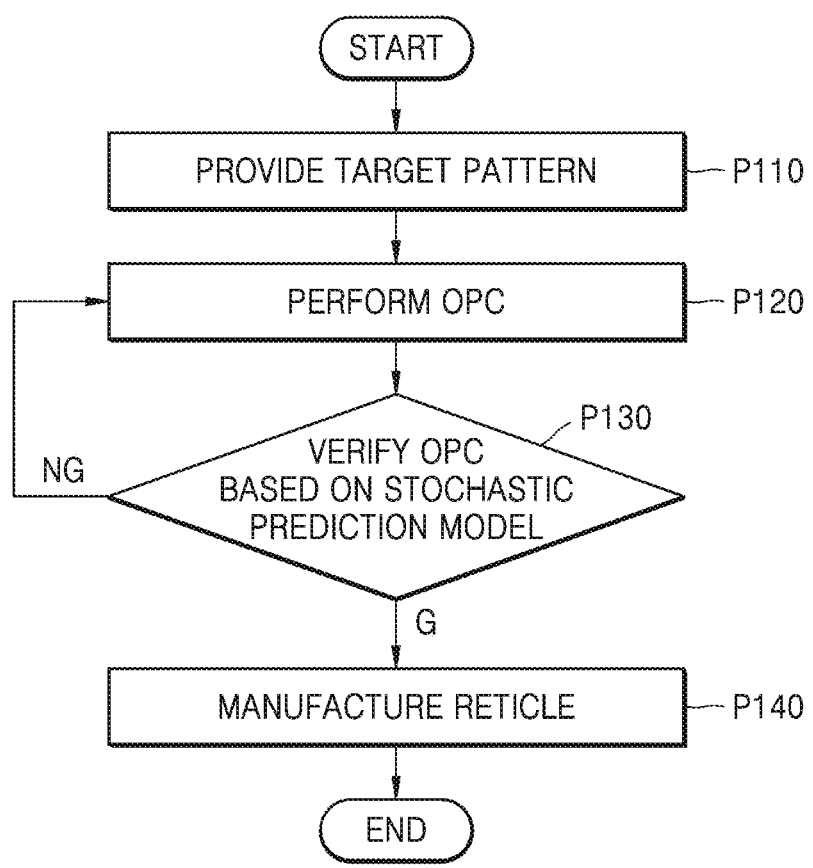
FIG. 7 is a flowchart showing a method of manufacturing a reticle, according to some embodiments of the inventive concepts.

FIG. 7 is a flowchart showing a method of manufacturing a reticle, according to some embodiments of the inventive concepts.

Referring to FIG. 7, in operation P110, a design layout may be provided. Providing of the design layout may be determined variously depending on a type and a purpose of a semiconductor device to be implemented. According to some embodiments, the semiconductor device may be non-volatile NAND flash memory. According to some embodiments, the semiconductor device may include phase-change random access memory (PRAM), magnetoresistive RAM (MRAM), resistive RAM (ReRAM), ferroelectric RAM (FRAM), NOR flash memory, etc. The semiconductor device may be volatile memory device in which data is lost upon shutoff of power, like dynamic random-access memory (DRAM), static random-access memory (SRAM), etc. According to some embodiments, the semiconductor device may be a logic chip, a measurement device, a communication device, a digital signal processor (DSP), a system-on-chip (SOC), etc.

Through providing of the design layout, a mask image corresponding to a pattern (hereinbelow, a target pattern) to be formed on the wafer may be provided. The mask image may include, for example, a continuous transmission mask image, a binary mask image, a curvilinear mask image, etc.

Next, in operation P120, OPC may be performed. OPC may include rule-based OPC, model-based OPC, and/or machine learning-guided OPC. The rule-based OPC may be driven by a lookup table that is calculated in advance based on a width and an interval between features. The model-based OPC may be driven using a compact model to dynamically simulate a final pattern, and an optimal solution may be found by inducing bias (movement) of an edge divided into sections. The machine learning-guided OPC may be a method of directly obtaining a mask image on which OPC is performed from a target layout, by using a machine-learning algorithm, without performing iterative lithography simulation. When one segment of a design layout expressed as a parameter (e.g., a pattern density, an optical kernel signal, etc.) is input to a pre-trained artificial neural network, bias of the segment may be output. As the artificial neural network determines and applies bias for all segments, an OPC mask image may be generated. In some cases, model-based OPC may be performed successively from machine learning-guided OPC, thereby improving the speed of OPC without lowering the accuracy of OPC.

Performing model-based OPC may include executing and/or simulating a process model by using an initial mask image as an input and generating a process image to be formed on a wafer. Herein, the process image may include, for example, the aerial image, the resist image, the etching image, etc. In an embodiment, the process model may include a mask transmission model coupled to an optical model, which is additionally coupled to a resist model and/or an etching model. An output of the process model may be a process image considering a process change during a simulation process. The process image may be additionally used to determine a parameter (e.g., an edge placement error (EPE), a critical dimension, an overlay, a side lobe, etc.) of a patterning process by tracking a contour of a pattern in the process image.

Performing model-based OPC may include generating an optical OPC model and a resist OPC model.

Generation of the optical OPC model may include optimization of a defocus stand (DS) position, a best focus (BF) position, etc., in exposure processing. Moreover, generation of the optical OPC model may include optimization of light diffraction or an optical state of exposure equipment, etc.

Generation of the resist OPC model may include optimization of a threshold value of a resist. Herein, the threshold value of the resist may mean a threshold value at which chemical change occurs in an exposure process, and the threshold value may be related to an intensity of exposure light. Generation of the resist OPC model may include selecting a proper model form from among several resist model forms. Herein, the resist model form may include a composition of chemical properties of the resist.

The model-based OPC is an iterative modification process in which the initial image is gradually modified to generate different types of images according to different process conditions such that information including a mask pattern (or an image) used to finally manufacture a mask may be generated. OPC may be repeated to reduce or minimize a cost function. OPC may be terminated at a point when the cost function is minimized, or after arrival at a preset repetition limit. Herein, a parameter of the cost function may include, for example, an EPE, sidelobe printing, a mean square error (MSE), a pattern placement error (PPE), a normalized image log, and other proper parameters defined based on a contour of a pattern.

Performing OPC may include adding sub-lithographic features referred to as serifs at a corner of a pattern or adding sub-lithographic assist features such as scattering bars, as well as transformation of a layout of the pattern. The serif, which is a rectangular feature at each corner of a pattern, may be used to "sharpen" corners of the pattern or compensate for a distortion factor caused by intersection of the pattern. A subresolution assist feature (SRAF), which is an auxiliary feature introduced to solve an OPC deviation problem caused by a density difference of the pattern, may be formed to a size less than a resolution of exposure equipment and thus may not be transferred to a resist layer.

Next, referring to FIGS. 6A and 7, in P130, OPC may be verified by the stochastic prediction model 10.

Verification of OPC, performed by the stochastic prediction model 10, may include generating a contour histogram image, by the stochastic prediction model 10, based on at least any one of a design layout that is a target of OPC or a resist image, an aerial image, a slope map, a density map, or a photo map corresponding to the design layout.

Conventional OPC verification predicts a probability of occurrence of a pinch and a bridge of a pattern implemented on the wafer based on a process window condition (PWC) obtained from a contour band. The best condition may mean an optimal dose and a condition of focus to form a particular layout. The best condition may differ from device to device to be formed and from pattern to pattern to be implemented.

The PWC may be a focus condition defocused by a set value from the best condition and/or a condition of a dose changed by the set value from the best condition. According to some embodiments, the PWC may include a plurality of focus and dose conditions. For example, the PWC may include one focus and dose condition or a continuous focus and dose condition.

Thus, stochastic analysis of a contour position of conventional OPC is difficult and/or impossible, and only a prediction of a stochastic defect based on a Monte Carlo method may be possible. The Monte Carlo method refers to a stochastic method that calculates a value of a function by using a random number. When a value to be calculated is not expressed in a closed form or is very complicated, the Monte Carlo method is used to approximately calculate the value. When a stochastic defect is predicted using the Monte Carlo method, numerous random numbers are required to improve the accuracy of simulation. Therefore, it is difficult to commonly use the Monte Carlo simulation because it requires an enormous amount of time and computing resources.

According to some embodiments, a contour histogram may be output using at least any one of the design layout, the resist image, the aerial image, the slope map, the density map, and/or the photo map as an input, such that stochastic prediction for an aspect of a defect may be simulated merely with short time and low-level computing resources.

In addition, by generating the contour histogram image, it is possible to stochastically verify OPC in addition to the confirmation of the process margin, so that the reliability of semiconductor device manufacturing can be improved. The stochastic OPC verification may be performed based on a mean value, a maximum value, a minimum value, a range, a median value, a mode, and/or a standard deviation of a position of a contour of a particular feature on the contour histogram image.

Moreover, a defect caused by a lithography process may be stochastically predicted based on interpretation of the contour histogram image. For example, by calculating a probability that a first segment of a first pattern and a second segment of a second pattern that is adjacent to the first pattern are adjacent to each other within a distance less than a set distance, e.g., a distance causing a bridge, a probability of a bridge defect occurring may be predicted.

In addition, according to some embodiments, an optimal processing condition may be determined for each specific process based on the stochastic prediction. For example, a combination of an illumination condition and a photoresist condition corresponding to an optimal process may be provided to a particular design layout including information such as a critical poly pitch, a critical line width, etc. The illumination condition may include a numerical aperture, an ambient refractive index, optical characteristics of a film structure, an exposure dose and focus, a focus blur (which may occur due to a stage gradient, a stage synchronization error, a laser bandwidth, etc.), illumination intensity, polarization, the thickness of a pellicle, a project lens aberration, etc. The photoresist condition may include a thickness, a polymer concentration, flatness, photoacid generator (PAG) concentration, a quantum yield of the PAG, an absorbance, etc.

Figure 8:
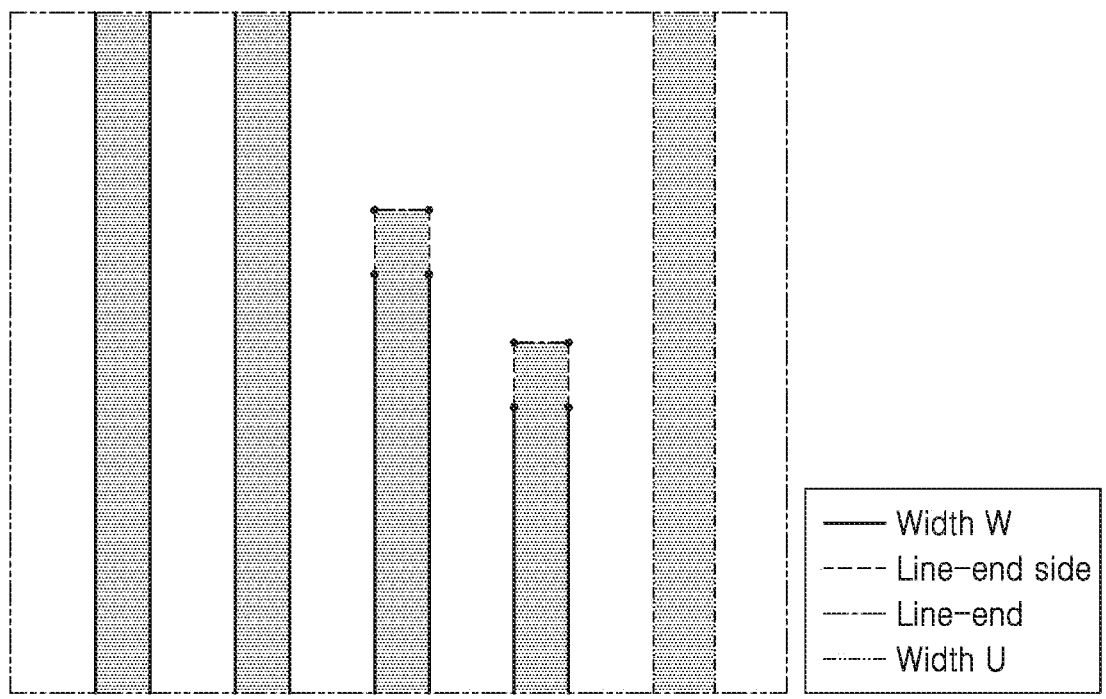
FIG. 8 is a schematic view for describing verification of an OPC result, according to some embodiments of the inventive concepts.

FIG. 8 is a schematic view for describing verification of an OPC result, according to some embodiments of the inventive concepts.

Referring to FIG. 8, different contours of different patterns may be dissected into different types of segments on a layout based on pattern characteristics and a surrounding environment.

For example, in FIG. 8, segments of a contour of a pattern extending with a width 'W' are indicated by a solid line, segments at an end of a line pattern are indicated by a dash-single dotted line, segments of a contour adjacent to the end of the line shape pattern are indicated by a dashed line, and segments of a contour of a pattern extending with a width 'U' are indicated by dash-double dotted line.

According to some embodiments, stochastic analysis may be performed for respective segments having different geometric characteristics as described above. For example, a mean value, a maximum value, a minimum value, a range, a median value, a mode, and/or a standard deviation of a position of the contour over all segments of the contour of the pattern extending with a width of 'W' may be determined, based on which a defect of the pattern extending with a width 'W' may be stochastically predicted. This is also applied to segments at an end of a line pattern, segments of a contour adjacent to the end, and segments of the contour of the pattern extending the width 'U'.

According to some embodiments, the stochastic prediction model 10 (see FIG. 6A) may perform stochastic analysis of contour placement for each type of segment in addition to stochastic analysis of contour placement for each pixel.

Referring back to FIG. 7, when an OPC verification result is good (G) (e.g., correct) in operation P130, a reticle may be manufactured in operation P140. When the OPC verification result is not good (NG) (e.g., incorrect) in operation P130, OPC may be performed again, going back to P120.

In operation P140, reticle manufacturing may include mask tape-out (MTO), mask data preparation (MDP), and mask exposure.

The MTO may be a request for manufacturing a mask by delivering mask design data which has completed OPC, for example, to a mask manufacturing house. Such MTO design data may have a graphic data format used in electronic design automation (EDA) software, etc. For example, the MTO design data may have a data format such as graphic data system II (GDS2), open artwork system interchange standard (OASIS), etc.

The MDP may include format conversion called fracturing, a barcode for machine-based reading, a standard mask pattern for inspection, augmentation such as job deck, etc., and automatic and manual verification. Herein, the job deck may mean generation of a text file regarding a series of commands such as placement information of multiple mask files, a reference dose, an exposure speed or scheme, etc.

Format conversion, i.e., fracturing, may mean a process of changing the MTO design data into a format for an electron beam exposure by fracturing the MTO design data for each region. Fracturing may include data manipulation, for example, scaling, data sizing, data rotation, pattern radiation, color inversion, etc. In conversion through fracturing, data regarding numerous systematic errors likely to occur in delivery from design data to an image on a wafer may be corrected. A data correction process for the systematic errors may be referred to as mask process correction (MPC), and may include line width adjustment called CD adjustment and a task of improving the accuracy of pattern placement. Thus, fracturing may contribute to improvement of the quality of a final mask and may be proactively performed for mask process correction. Herein, systematic errors may be caused by distortion occurring in an exposure process, a mask development and etching process, a wafer imaging process, etc.

The MDP may include the MPC. The MPC may refer to a process of correcting an error occurring in the exposure process, i.e., a systematic error. Herein, the exposure process may be a concept including overall electron beam writing, development, etching, baking, etc. In addition, data processing may be performed before the exposure process. The data processing refers to a preprocessing process regarding a sort of mask data, and may include a grammar check for the mask data, exposure time prediction, etc.

After the MDP, a mask wafer may be exposed based on the mask data. Herein, exposure may mean, for example, electron beam writing. The electron beam writing may be performed in a gray writing manner using, for example, a multi-beam mask writer (MBMW). The electron beam writing may be performed using a variable shape beam (VSB) exposure.

After mask data preparation, a process of converting mask data into pixel data before exposure may be performed. The pixel data may be data directly used for actual exposure, and may include data regarding a shape of an exposure target and data regarding a dose assigned to each data. Herein, the data regarding the shape may be bit-map data converted from shape data, which is vector data, through rasterization, etc.

After exposure, a series of processes may be performed to manufacture a mask. The series of processes may include, for example, development, etching, cleaning, etc. The series of processes for mask manufacturing may include a measurement process and a defect check or repair process. After exposure, when absence of pollutant particles or chemical stain is determined through final cleaning or inspection, a pellicle may be applied to a mask. By applying the pellicle to the mask, the mask may be protected from a subsequent pollutant for an available lifetime.

Figure 9:
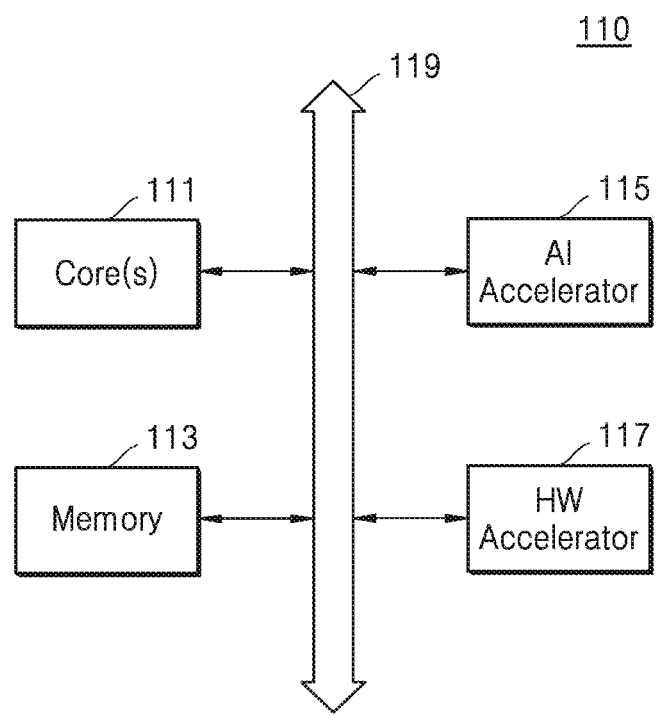
FIG. 9 is a block diagram of a device according to some embodiments of the inventive concepts.

FIG. 9 is a block diagram of a device 110 according to some embodiments of the inventive concepts. In some embodiments, the method described with reference to FIG. 8 may be performed by the device 110 of FIG. 9.

Referring to FIG. 9, the device 110 may include at least one core 111, memory 113, an artificial intelligence (AI) accelerator 115, and a hardware (HW) accelerator 117, which may mutually communicate with one another through a bus 119. In some embodiments, the at least one core 111, the memory 113, the AI accelerator 115, and the HW accelerator 117 may be included in one semiconductor chip. In some embodiments, at least two of the at least one core 111, the memory 113, the AI accelerator 115, and the HW accelerator 117 may be included in each of two or more semiconductor chips mounted on a wafer (a board).

The at least one core 111 may execute instructions. For example, the at least one core 111 may execute an operating system by executing instructions stored in the memory 113, and execute applications executed on the operating system. In some embodiments, the at least one core 111 may instruct the AI accelerator 115 and/or the HW accelerator 117 to perform a task or to obtain a result of performing the task from the AI accelerator 115 and/or the HW accelerator 117, by executing the instructions. In some embodiments, the at least one core 111 may be an application specific instruction set processor (ASIP) customized for a specific purpose and may support a dedicated instruction set.

The memory 113 may have a random structure for storing data. For example, the memory 113 may include a volatile memory device such as DRAM, SRAM, etc., and a non-volatile memory device such as flash memory, ReRAM, etc. The at least one core 111, the AI accelerator 115, and the HW accelerator 117 may store data from the memory 113 or read data from the memory 113, through the bus 119.

The AI accelerator 115 may denote hardware designed for AI applications. In some embodiments, the AI accelerator 115 may include a neural processing unit (NPU) for implementing a neuromorphic structure, generate output data by processing input data provided from the at least one core 111 and/or the HW accelerator 117, and provide output data to the at least one core 111 and/or the HW accelerator 117. In some embodiments, the AI accelerator 115 may be programmable, and may be programmed by the at least one core 111 and/or the HW accelerator 117.

The HW accelerator 117 may denote hardware designed to perform a particular task at a high speed. For example, the HW accelerator 117 may be designed to perform data conversion, such as demodulation, modulation, encoding, decoding, etc., at a high speed. The HW accelerator 117 may be programmable, and may be programmed by the at least one core 111 and/or the HW accelerator 117.

The device 110 may perform a method of modeling a semiconductor process according to an embodiment, and may be denoted as a device for modeling a semiconductor process. For example, the AI accelerator 115 may perform the operations of the stochastic prediction model 10 described with reference to FIG. 6A.

While the inventive concepts have been particularly shown and described with reference to embodiments thereof, it will be understood that various changes in form and details may be made therein without departing from the scope of the following claims.

What is claimed is:

1. A method of providing a stochastic prediction system, the method comprising:
    extracting contours of patterns corresponding to a first design layout from a plurality of scanning electron microscope (SEM) images, respectively;
    generating a first contour histogram image based on the contours; and
    training a stochastic prediction model by using the first contour histogram image as an output, and by using the first design layout and a first resist image, a first aerial image, a first slope map, a first density map, and/or a first photo map corresponding to the first design layout as inputs,
    wherein the stochastic prediction model comprises a cycle generative adversarial network (GAN).

2. The method of claim 1, wherein a value of a pixel of the first contour histogram image indicates a number of the contours located in the pixel.

3. The method of claim 1, wherein the stochastic prediction model is configured to predict a probability of an occurrence of a defect due to extreme ultraviolet (EUV) exposure.

4. The method of claim 1, wherein the stochastic prediction model is configured to output a second contour histogram image corresponding to a second design layout based on a second resist image, a second aerial image, a second slope map, a second density map, and/or a second photon map corresponding to the second design layout.

5. The method of claim 4, wherein the second contour histogram image comprises information about a mean value, a maximum value, a minimum value, a range, a median value, and/or a standard deviation of contour placement for a pixel of the second contour histogram image.

6. The method of claim 4, wherein the stochastic prediction model is configured to verify optical proximity correction (OPC) with respect to the second design layout, based on the second contour histogram image.

7. The method of claim 4, wherein the stochastic prediction model is configured to classify segments of a contour of a pattern included in the second design layout according to a segment type and to stochastically interpret the segments.

8. The method of claim 4, further comprising adjusting a process condition for transferring the second design layout to a wafer based on the second contour histogram image.

9. The method of claim 8, wherein the process condition comprises an optical condition and a resist condition of a lithography process.

10. A method of manufacturing an extreme ultraviolet (EUV) photomask, the method comprising:
    providing a design layout;
    performing an optical proximity correction (OPC) on the design layout;
    verifying the OPC; and manufacturing an EUV photomask responsive to determining that a result of the verifying of the OPC is correct, wherein the verifying of the OPC comprises generating a contour histogram image based on the design layout and a resist image, an aerial image, a slope map, a density map, and/or a photon map corresponding to the design layout, and wherein a value of a pixel included in the contour histogram image indicates a probability that a contour of patterns included in the design layout is located in the pixel.

11. The method of claim 10, wherein the contour histogram image comprises information about a mean value, a maximum value, a minimum value, a range, a median value, and/or a standard deviation of contour placement for the pixel included in the contour histogram image.

12. The method of claim 10, wherein the verifying of the OPC comprises use of a stochastic prediction model that is configured to classify segments of the contour of the patterns included in the design layout according to a segment type and to stochastically interpret the segments.

13. The method of claim 10, wherein the contour histogram image is generated by a cycle generative adversarial network (GAN) that uses the design layout, the resist image, the aerial image, the slope map, the density map, and/or the photo map as an input.

14. A system configured to stochastically predict a defect caused by a lithography process, the system comprising a stochastic prediction model configured to generate a first contour histogram image, wherein the first contour histogram image is generated based on a first design layout and a first resist image, a first aerial image, a first slope map, a first density map, and/or a first photon map corresponding to the first design layout, and wherein a value of a pixel included in the first contour histogram image indicates a probability that a contour of patterns included in the first design layout is located in the pixel.

15. The system of claim 14, wherein the first contour histogram image comprises information about a mean value, a maximum value, a minimum value, a range, a median value, and/or a standard deviation of contour placement for the pixel.

16. The system of claim 14, wherein the stochastic prediction model comprises a cycle generative adversarial network (GAN).

17. The system of claim 16, wherein the stochastic prediction model is trained by using as inputs a second design layout and a second resist image, a second aerial image, a second slope map, a second density map, and/or a second photon map corresponding to the second design layout.

18. The system of claim 17, wherein the stochastic prediction model is configured to perform an image-to-image translation that maps the inputs to an output that comprises a second contour histogram image corresponding to the second design layout.

19. The system of claim 14, wherein the stochastic prediction model is configured to predict a probability of occurrence of a defect due to extreme ultraviolet (EUV) exposure.

20. The system of claim 14, wherein the stochastic prediction model is configured to classify a segment of the contour of the patterns included in the first design layout according to a segment type and to stochastically interpret the segment.

* * * * *